United States Patent [19]
Temple

[11] Patent Number: 5,517,058
[45] Date of Patent: May 14, 1996

[54] SEMICONDUCTOR PACKAGE AND METHOD WITH VERTICALLY EXTENDED ELECTRODE LEADS

[75] Inventor: Victor A. K. Temple, Clifton, N.Y.

[73] Assignee: Harris Corporation, Melbourne, Fla.

[21] Appl. No.: 476,679

[22] Filed: Jun. 7, 1995

Related U.S. Application Data

[63] Continuation of Ser. No. 202,168, Feb. 25, 1994, abandoned.

[51] Int. Cl.[6] .................................................. H01L 23/34
[52] U.S. Cl. ........................... 257/692; 257/693; 257/723
[58] Field of Search ................................... 257/723, 724, 257/728, 735, 690, 692, 693, 694, 695, 696, 697, 606, 706

[56] References Cited

U.S. PATENT DOCUMENTS

| 3,864,727 | 2/1975 | Schoberl | 257/706 |
| 4,819,042 | 4/1989 | Kaufman | 257/676 |

FOREIGN PATENT DOCUMENTS

| 2819327 | 12/1979 | Germany | 257/723 |

Primary Examiner—Sara W. Crane
Assistant Examiner—S. V. Clark

[57] ABSTRACT

A package for one or more semiconductor devices has an electrically insulative and thermally conductive base on a thermally conductive support. The semiconductor devices may be enclosed in an encapsulant and are electrically contacted through leads that extend through the encapsulant.

33 Claims, 2 Drawing Sheets

SEMICONDUCTOR PACKAGE AND METHOD WITH VERTICALLY EXTENDED ELECTRODE LEADS

This is a continuation of application Ser. No. 08/202,168, filed Feb. 25, 1994, now abandoned.

BACKGROUND OF THE INVENTION

The present invention relates to packages for semiconductor devices, and more particularly to an improved base for a semiconductor package that electrically isolates the package from the heat sink on which it is mounted and that provides low thermal resistance.

With reference now to FIG. 1, prior art packages 10 for semiconductor devices typically include an encapsulant 12 enclosing and protecting a semiconductor device (not shown) to which are attached one or more leads 14 (e.g., gate, source and drain; anode and cathode), with the number and type depending on the semiconductor device enclosed within the package 10. The package 10 may be attached by conventional means 16 to a heat sink 18 for conveying away heat generated by the semiconductor device. The package 10 may be electrically isolated from the heat sink (and thus from other packages carried by the heat sink 18) by an insulator 20 that also is thermally conductive, such as mica. The bottom of the package 10 desirably has high thermal conductivity to facilitate conveyance of heat from the semiconductor device. To this end, the bottom of the package 10 has typically been a thermally conductive metal that is usually also electrically conductive, such as copper; hence the need for the insulator 20 to isolate the package 10.

As is apparent, the insulator 20 adds cost and complexity to the package mounting problem, and is desirably eliminated. But the insulator could not be eliminated so long as the package, and particularly its bottom, was an electrically conductive material.

It is also apparent that the package, particularly the one illustrated in FIG. 1, can only have a limited number of electrical leads 14 extending from the side of the package. Further, the side mounted leads make the placement of multiple semiconductor devices within the package particularly difficult. This is especially apparent in view of the commercially standardized shapes and sizes of the packages (e.g., the TO-xxx family of standard packages). The standard shapes and sizes limit flexibility in selecting which multiple semiconductor devices may be used, forcing uneconomical compromises in numbers and types of devices.

In part because the leads 14 extend from the side, it has been customary to connect the leads 14 to the semiconductor device with wire that is bonded or soldered to the device and to the lead. These attachment methods may increase impedance and consume valuable real estate.

Accordingly, it is an object of the present invention to provide a novel package and method of packaging semiconductor devices that obviates the problems of the prior art without increasing complexity or cost.

It is another object of the present invention to provide a novel package and method of packaging semiconductor devices that electrically isolates each package from the heat sink and provides low thermal resistance.

It is yet another object of the present invention to provide a novel package and method of packaging semiconductor devices in which the package base is an electrical insulator, such as AlN, BeO or pressed diamond.

It is still another object of the present invention to provide a novel package and method of packaging semiconductor devices in which the package base is an electrical insulator that is supported by a thermally conductive support.

It is a further object of the present invention to provide a novel package and method of packaging in which an electrically conductive foil is affixed to an insulative base for the package and to which the semiconductor devices are affixed.

It is yet a further object of the present invention to provide a novel package and method of packaging semiconductor devices in which a conductive foil affixed to an insulative base and electrode leads extending from the semiconductor devices have portions that extend vertically so that multiple semiconductor devices may be placed in the package.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
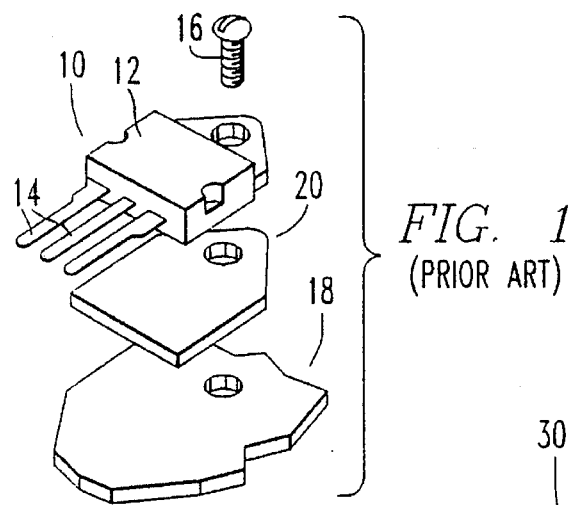
FIG. 1 is a pictorial depiction of a prior art package for a semiconductor device illustrating a suggested mounting method.
Figure 2:
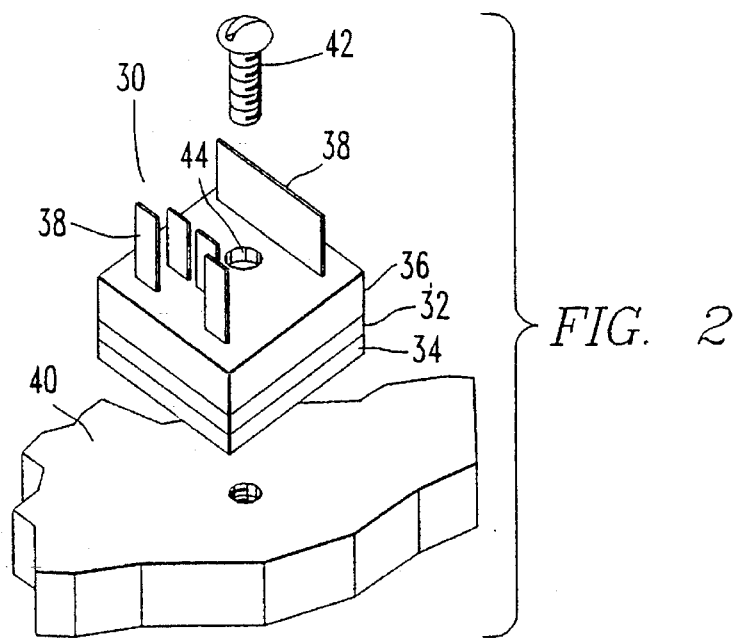
FIG. 2 is a pictorial depiction of an embodiment of the package of the present invention illustrating a mounting method.

With reference now to FIG. 2, an embodiment of the present invention may include a package 30 having an electrically insulative and thermally conductive base 32 on a thermally conductive support 34. As will be explained below, one or more semiconductor devices (not shown in FIG. 2) may be enclosed in an encapsulant 36 and may be electrically contacted through leads 38 that extend from the encapsulant 36. The package 30 may be mounted on a heat sink 40 using conventional techniques, such as mechanical gripping devices 42 or adhesive.

The electrically insulative and thermally conductive base 32 replaces the conventional electrically conductive bases in prior art packages. The material in the base is chosen so that the thermal resistance is low and so that the package is electrically isolated from the heat sink on which it is mounted. To this end, the base 32 may include one or more materials such as aluminum nitride, beryllium oxide and pressed diamond, along with binder and/or matrix substances as may be needed to achieve other desired characteristics, such as flexibility, durability, weight, etc. The base 32 desirably has a coefficient of thermal expansion compatible with the material in the semiconductor device substrate (usually silicon) so that thermal stress induced by temperature changes in the semiconductor device may be reduced. A base with a coefficient of thermal expansion within about one-half to three times the coefficient of thermal expansion of silicon has been found acceptable. For example, the coefficient of thermal expansion of aluminum nitride is about 1.6 times that of silicon, beryllium oxide about 2.4 times, and diamond about 0.6 times. The thickness of the base 32 may vary depending on the size of the package, with a base about 25 to 75 mils thick having been found acceptable for packages with a width up to about an inch.

The support 34 provides mechanical support for the base 32 and desirably is as thermally conductive as the base 32 to sustain the low thermal resistance. The support 34 may be any suitable material, such as a metal, that provides the requisite mechanical support and low thermal resistance and may be affixed to the base 32 by bonding (e.g., thermal compression bonding, reaction bonding, direct bond copper), or other conventional methods suitable for the environment in which the package is likely to operate. The thickness of the support 34 is desirably less than or equal to that of the base 32, although this is not a requirement of the present invention. The support 34 also may be a foil or may be included within or be part of the base 32 (such as a binder) so that the support 34 may not be separately identifiable.

The encapsulant 36 may be any conventional material for packaging semiconductor devices, such as plastic or glass loaded epoxy.

The package 30 may be provided with a mount-down hole 44 for the mounting hardware 42 that extends through the encapsulant 36, base 32 and support 34. The mount-down hole 44 may be mold formed in a conventional manner or may be drilled using conventional methods (e.g., laser, drill bit), leaving a gap between the periphery of the hole 44 and any electrically conductive material through which it passes to allow for creep and/or strike in the package.

Figure 3:
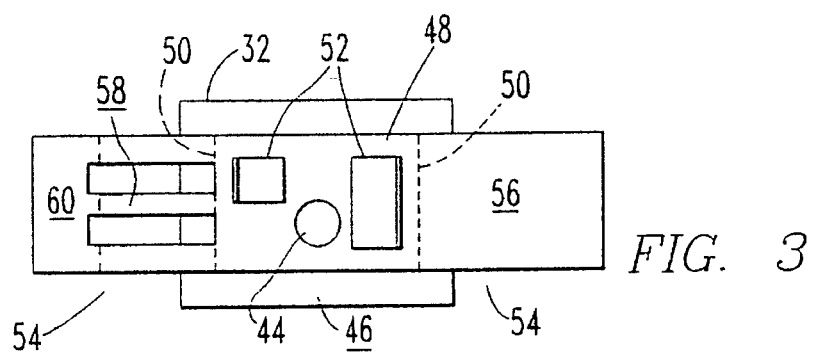
FIG. 3 is an overhead plan view of an embodiment of the present invention with the encapsulation material removed for clarity, the top foil extended horizontally and the electrode foils extended vertically.

With reference now to FIG. 3 (a top plan view of an embodiment of the present invention before encapsulation), a surface 46 of the insulative base 32 opposite the surface to which the support 34 may be affixed, may be provided with an electrically conductive foil 48 that has a portion affixed to the surface 46. The affixed portion of the foil 48 may be seen in FIG. 3 as the central portion between the fold lines 50. The foil 48 may be affixed to the surface 46 by bonding (e.g., thermal compression bonding, reaction bonding, direct bond copper), or other conventional methods suitable for the environment in which the package is likely to operate.

One or more semiconductor devices 52 may be affixed to the foil 48 in the affixed central portion of the foil 48 so that a terminal of the semiconductor device contacts the foil 48, making the foil 48 an electrical lead for the contacted terminal. The foil 48 has one or more portions 54 that are not affixed to the surface 46 and that extend beyond the edge of the base 32. The portions 54 are the leads for the semiconductor device 52 that may be contacted when the package is integrated into a circuit. The portions 54 may take any suitable shape, such as a tab 56 or prongs 58. The prongs 58 may be formed by removing a connector 60. As will be discussed below, in a preferred embodiment the portions 54 may be folded on lines 50 and extended from the base generally perpendicular to the surface 46 (e.g., as illustrated in FIG. 4), or may extend generally parallel to the surface 46 (e.g., as illustrated in FIG. 7).

Figure 4:
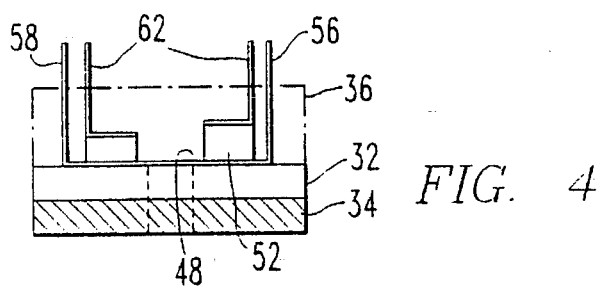
FIG. 4 is a side view in elevation of the embodiment of FIG. 3 with the top and electrode foils extended vertically and encapsulation material shown in outline.

With reference now to FIG. 4 (a side view of the embodiment of FIG. 3 with the encapsulant 36 shown in outline), the semiconductor devices 52 may have an electrical lead foil 62 extending from a terminal thereof. The foil 62 may be affixed to the terminal of the semiconductor device by bonding (e.g., thermal compression bonding, reaction bonding, conductive epoxy), or other conventional methods suitable for the environment in which the package is likely to operate. In the event the foil 62 is bonded to the semiconductor device with conductive epoxy the portion of the foil to be encapsulated may be coated with an epoxy gel. Before encapsulation, the foil 62 may be folded to extend in the same direction as the portions 56 and 58 so that the foil 62 and portions 56 and 58 are exposed after encapsulation to permit electrical contact therewith.

Figure 5:
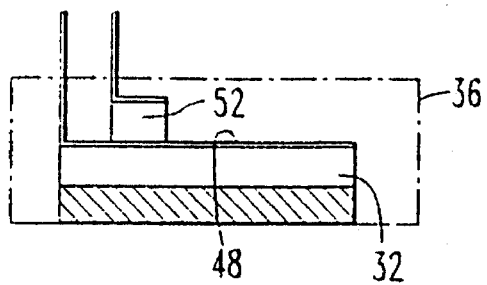
FIG. 5 is a side view in elevation of another embodiment of the present invention with the top and electrode foils extended vertically and encapsulation material shown in outline, and in which the encapsulation material encloses the base.

The encapsulant 36 illustrated in FIGS. 2 and 4 is generally coextensive with the base 32. Where increased strength is desirable, or where the foil 48 extends to the edge of the base 32 (in contrast, the foil 48 in FIG. 3 is spaced from the edge of the base 32), the encapsulant may be larger (for example about 30 mils larger) than the base, such as may be seen in FIG. 5.

Figure 6:
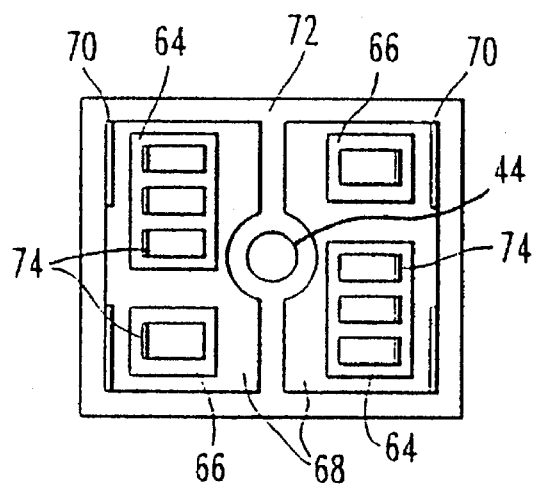
FIG. 6 is an overhead plan view of an embodiment of the present invention including two high power thyrister devices and related diodes with the encapsulation material removed for clarity and the foils extended vertically.

In an alternative embodiment, multiple semiconductor devices may be encapsulated, each with its own or shared foil contacts. For example, FIG. 6 illustrates a package for two MOS controlled thyristors (MCTs) 64 and two diodes 66 that can be used to make a half-bridge or DC switch. Each paired MCT and diode has its own foil 68 affixed to the base 72 with one or more portions 70 extending away from the base 72. Each MCT and diode also has an electrode contact 74 extending away from the base 72 in direction generally the same as the portions 70.

By way of further example, assembly of the device illustrated in FIG. 6 may include the following steps:

laser cutting a beryllium oxide base 72 to appropriate dimensions, including mount-down hole 44;

direct bonding to the bottom of base 72 a foil support having a thickness less than the base 72 (e.g., one-half the base thickness);

direct bonding the two foils 68 to the top of base 72;

nickel plate and pretin, as necessary, the base 72, the semiconductor devices 64 and 66, and the electrode contacts 74;

bond (for example, with high temperature solder) the foil 68 and the electrode contacts 74 to semiconductor devices 64 and 66; and encapsulate the semiconductor devices 64 and 66, and the foils 68, leaving the parts of portions 70 and contacts 74 exposed and leaving a mount-down hole.

The package produced by this method includes 2 switches isolated from each other and from the heat sink in a space little more than one inch on each side. The package is lightweight, is easily attached to a heat sink and provides low impedance.

Figure 7A:
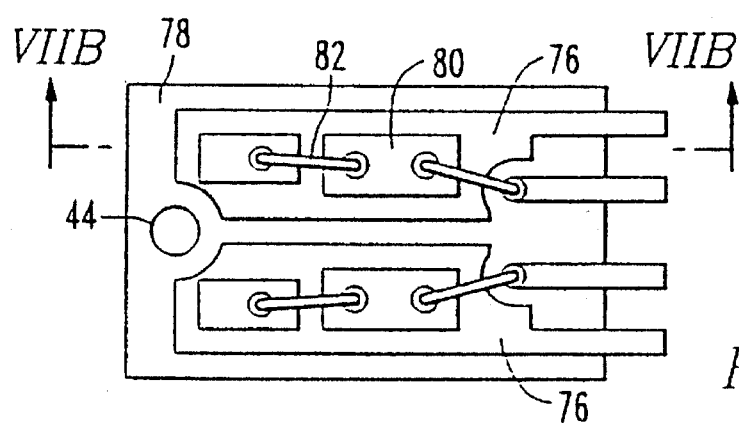
FIG. 7A is an overhead plan view and FIG. 7B is a corresponding vertical cross section of another embodiment of the present invention including two high power thyrister devices and related diodes with the encapsulation material removed for clarity, the top foil extended horizontally and without electrode foils.
Figure 7B:
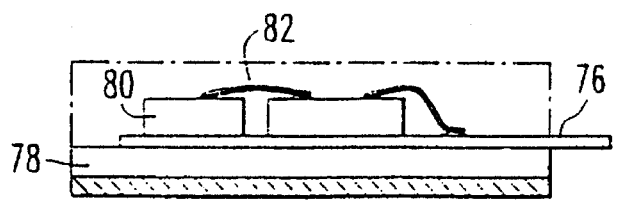

In another alternative embodiment, the semiconductor devices may be attached using conventional wire bonding methods such as illustrated in FIGS. 7A and 7B, albeit without the flexibility in design and small size that may be available with electrode contacts that extend perpendicular from the base. This embodiment may be suitable for use with much of the already existing automated assembly equipment for standard packages, such as the TO-247. The foil 76 is affixed to an insulative base 78 in the manner discussed above and extended generally parallel to the base 78. Semiconductor devices 80 may be connected to each other and/or to the leads using wires 82 and conventional wire bonding techniques.

The invention is not limited to the arrangements of semiconductor devices, leads, foils, mount-down holes and other components shown in the figures. While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A package for a semiconductor device comprising:
   a base comprising a thermally conductive and electrically insulative material that has a coefficient of thermal expansion sufficiently close to that of the semiconductor device so as to reduce thermal stress in said base and the semiconductor device;
   a bottom support affixed to a first surface of said base, said bottom support thickness being sufficient to reduce mechanical stress in said base;
   a top foil having a central portion affixed to a second surface of said base opposite said first surface, said top foil having an edge portion not affixed to said base, the semiconductor device being affixed to said top foil at said central portion so as to expose an electrode of the semiconductor device;
   an electrode foil having a bottom portion affixed to the exposed electrode of the semiconductor device and an end portion extending directly from said bottom portion generally perpendicular to said second surface; and
   an encapsulant for enclosing the semiconductor device and said top foil, leaving exposed said edge portion of said top foil and said end portion of said electrode foil so that electrical connections may be made therewith.

2. The package of claim 1 wherein said base insulative material is selected from the group of insulators consisting of aluminum nitride, beryllium oxide and pressed diamond.

3. The package of claim 1 wherein the thickness of said bottom support is less than or equal to the thickness of said base.

4. The package of claim 1 wherein said base has a thickness of 15 to 100 mils and the thickness of said bottom support is about one-half that of said base.

5. The package of claim 1 wherein said encapsulant comprises a plastic.

6. The package of claim 1 further comprising a passageway through said encapsulant, said base, said top foil and said bottom support for enabling mechanical attachment of said package to a heat sink.

7. The package of claim 1 wherein said electrode foil is bonded to The electrode of the semiconductor device.

8. The package of claim 7 wherein said electrode foil is thermal compression bonded to the electrode of the semiconductor device.

9. The package of claim 7 wherein said electrode foil is reaction bonded to the electrode of the semiconductor device.

10. The package of claim 7 wherein said electrode foil is bonded with conductive epoxy to the electrode of the semiconductor device.

11. The package of claim 1 wherein said end portion of said electrode foil is electrically contacted directly above the semiconductor device, when viewed from above said encapsulant.

12. The package of claim 1 wherein said top foil is bonded to said opposite surface of said base.

13. The package of claim 12 wherein said top foil is bonded to said opposite surface of said base with direct bond copper.

14. The package of claim 12 wherein said top foil is thermal compression bonded to said opposite surface of said base.

15. The package of claim 12 wherein said top foil is reaction bonded to said opposite surface of said base.

16. The package of claim 1 wherein said edge portion of said top foil is generally perpendicular to said second surface.

17. The package of claim 1 wherein said edge portion of said top foil is generally parallel to said second surface.

18. The package of claim 1 wherein said bottom support comprises a material having a coefficient of thermal conductivity about the same as or greater than that of said base.

19. The package of claim 1 wherein said edge portion of said top foil comprises plural prongs.

20. A package for a semiconductor device comprising:
    a thermally conductive and electrically insulative base that has a coefficient of thermal expansion approximately that of the semiconductor device;
    a top foil having a first portion affixed to a top surface of said base, and a second portion not affixed to said base, the semiconductor device being affixed to said top foil at said first portion;
    an electrode foil having a bottom portion affixed to an electrode of the semiconductor device and an end portion extending directly from said bottom portion generally perpendicular to said top surface of said base; and
    an encapsulant for enclosing the semiconductor device, said electrode foil, and said top foil and leaving exposed said second portion of said top foil and said end portion of said electrode foil so that electrical connections may be made therewith.

21. The package of claim 20 wherein said first portion of said top foil does not extend to the edges of said base so that said encapsulant encloses said top foil without enclosing the edges of said base.

22. The package of claim 20 wherein said first portion of said top foil extends to the edges of said base and wherein said encapsulant encloses the edges of said base so that said first portion is not exposed at the edges of the package.

23. The package of claim 20 wherein said second portion extends generally parallel to a plane of said top surface of said base.

24. The package of claim 20 wherein said second portion extends generally perpendicular to a plane of said top surface of said base.

25. The package of claim 20 wherein said end portion of said electrode foil is electrically contacted directly above the semiconductor device, when viewed from above said encapsulant.

26. A package for plural semiconductor devices that are electrically isolated from one another in the package, comprising an electrically insulative and thermally conductive base, an electrode foil for each of the semiconductor devices that is affixed to an electrode of, and extends directly above, its respective semiconductor device, and an encapsulant that encloses the semiconductor devices and parts of each said foil, an electrically contactable part of each said foil extending from said encapsulant above its respective semiconductor device.

27. A package for plural semiconductor devices that are electrically isolated from one another in the package, comprising an electrically insulative and thermally conductive base having a thickness of 15 to 100 mils, a bottom support affixed to said base having a thickness of about one half the thickness of said base, an electrode foil for each of the semiconductor devices that is affixed to an electrode of, and extends directly above, its respective semiconductor device, and an encapsulant that encloses the semiconductor devices and parts of each said foil, an electrically contactable part of each said foil extending from said encapsulant directly above its respective semiconductor device.

28. The package of claim 27 wherein said electrically contactable part of each said foil extends vertically from said encapsulant.

29. The package of claim 27 wherein said base has a thickness of 25 to 75 mils.

30. The package of claim 20 wherein said base has a thickness of 25 to 75 mils, and further comprising a support affixed to said base having a thickness of about one half the thickness of said base.

31. The package of claim 26 wherein said base has a thickness of 25 to 75 miles, and further comprising a support affixed to said base having a thickness of about one half the thickness of said base.

32. The package of claim 1 wherein said end portion of said electrode foil extends directly above the semiconductor device.

33. The package of claim 20 wherein said end portion of said electrode foil extends directly from said bottom portion generally perpendicular to said top surface of said base and in vertical registration with the semiconductor device.

* * * * *